US009489553B2

(12) United States Patent
Uebe et al.

(10) Patent No.: US 9,489,553 B2
(45) Date of Patent: Nov. 8, 2016

(54) METHOD AND APPARATUS FOR RECORDING STATUS OF SHIPPABLE GOODS

(71) Applicant: GLOBALFOUNDRIES Inc., Grand Cayman (KY)

(72) Inventors: Sebastian Uebe, Cottbus (DE); Tony Genenncher, Dresden (DE); Wolf-Peter Karst, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 123 days.

(21) Appl. No.: 13/917,088

(22) Filed: Jun. 13, 2013

(65) Prior Publication Data

US 2013/0341403 A1    Dec. 26, 2013

Related U.S. Application Data

(60) Provisional application No. 61/663,273, filed on Jun. 22, 2012.

(51) Int. Cl.
   G06K 7/10    (2006.01)
   G06K 7/00    (2006.01)
   H01L 21/67   (2006.01)

(52) U.S. Cl.
   CPC .......... G06K 7/10544 (2013.01); G06K 7/00 (2013.01); G06K 7/10009 (2013.01); H01L 21/67265 (2013.01); H01L 21/67294 (2013.01)

(58) Field of Classification Search
   CPC .............. Y10S 707/99945; Y10S 707/99948; Y10S 707/913; Y10S 707/99933; Y10S 707/99938; Y10S 435/809; G06F 17/30041; B07C 1/00; B65D 2203/02; B65D 23/085; G06K 7/0095; G06K 19/07749; G06K 19/02; G06K 19/07752; G06K 7/00; G06K 7/10009; G06K 7/10544; B31D 1/025; B29C 45/14647; H01L 21/67265; H01L 21/67294
   USPC ........ 455/566, 575.3; 235/375, 382, 462.08; 340/937
   See application file for complete search history.

(56) References Cited

U.S. PATENT DOCUMENTS

| | | | |
|---|---|---|---|
| 5,979,756 A * | 11/1999 | Ahn et al. ...................... 235/383 |
| 2001/0020643 A1* | 9/2001 | Matsumoto et al. ..... 235/462.05 |
| 2008/0035520 A1* | 2/2008 | Caracciolo et al. .......... 206/531 |
| 2008/0217405 A1* | 9/2008 | Jenney ..................... G06K 1/18 235/385 |
| 2011/0054668 A1* | 3/2011 | Holmes et al. ............... 700/216 |
| 2012/0130308 A1* | 5/2012 | Silkaitis et al. .............. 604/151 |

FOREIGN PATENT DOCUMENTS

JP    2009274743 A  * 11/2009

OTHER PUBLICATIONS

Translation of Chinese Office Action Dated Jan. 25, 2016 for CN Application No. 2013102498642 , filed on Jun. 21, 2013.

* cited by examiner

*Primary Examiner* — Sonji Johnson
(74) *Attorney, Agent, or Firm* — Amerson Law Firm, PLLC

(57) ABSTRACT

An apparatus includes a packaging supporter including a base having a top surface, an imaging device that is oriented and adapted to capture an image of a shipping carrier disposed on the top surface, and an image processing unit operable to extract identification data from the image, create an output file including the image, and index the output file using the extracted identification data.

12 Claims, 7 Drawing Sheets

METHOD AND APPARATUS FOR RECORDING STATUS OF SHIPPABLE GOODS

CROSS-REFERENCE TO RELATED APPLICATIONS

Not applicable.

BACKGROUND

The disclosed subject matter relates generally to manufacturing and, more particularly, to a method and apparatus for recording status of shippable goods.

It is common to ship delicate goods, such as semiconductor wafers in specialized shipping carriers that serve to isolate and protect the individual pieces within the packaging. In the context of semiconductor wafers, it is common for a shipping carrier to include multiple slots, with each slot being adapted to hold a single wafer. Wafers are loaded into the shipping carrier in a clean room environment, the shipping carrier is labeled, and the carrier is wrapped for shipment.

In some instances, when the shipping carrier is received by the customer, some of the wafers are broken or cross-slotted. It is difficult to demonstrate whether this condition was the result of improper loading or mishandling by the shipping carrier.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY OF EMBODIMENTS

The following presents a simplified summary of only some aspects of embodiments of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

The present application is directed to various methods, systems and devices for recording the status of shippable goods. One illustrative method disclosed herein for capturing the state of a shipping carrier includes capturing an image of a shipping carrier that has a transparent surface that exposes a plurality of manufactured items therein and a label, extracting identification data provided on the label from the image, creating an output file including the image and indexing the output file using the extracted identification data.

Another illustrative method disclosed herein for capturing the state of a shipping carrier includes capturing an image of a shipping carrier that has a transparent surface that exposes a plurality of manufactured items therein and a display unit that is operatively coupled to an RFID chip, extracting identification data provided on the display unit from the image, creating an output file including the image and indexing the output file using the extracted identification data.

One illustrative apparatus disclosed herein includes a packaging supporter comprised of a base having a top surface, an imaging device oriented to capture an image of a shipping carrier disposed on the top surface and an image processing unit operable to extract identification data from the image, create an output file including the image, and index the output file using the extracted identification data. In some embodiments, the imaging device is positioned within the base, while in other embodiments the imaging device is positioned above the top surface of the base.

One illustrative system disclosed herein includes a packaging supporter comprised of a base having a transparent top surface, a shipping carrier positioned above the transparent top surface of the base, wherein the shipping carrier includes a transparent surface that exposes a plurality of manufactured items positioned in the shipping carrier and a label, an imaging device positioned within the base, wherein the imaging device is oriented and adapted to capture an image of the shipping carrier, the plurality of manufactured items positioned in the shipping carrier and the label, and an image processing unit operable to extract identification data from the image, create an output file including the image, and index the output file using the extracted identification data.

Another illustrative system disclosed herein includes a packaging supporter comprised of a base having a transparent top surface, a shipping carrier positioned above the transparent top surface of the base, wherein the shipping carrier includes a transparent surface that exposes a plurality of manufactured items positioned in the shipping carrier and a display unit that is operatively coupled to an RFID chip, an imaging device positioned within the base, wherein the imaging device is oriented and adapted to capture an image of the shipping carrier, the plurality of manufactured items positioned in the shipping carrier and information displayed on the display unit, and an image processing unit operable to extract identification data from the image, create an output file including the image, and index the output file using the extracted identification data.

Yet another illustrative system disclosed herein includes a packaging supporter comprised of a base having a top surface, a shipping carrier positioned above the top surface of the base, wherein the shipping carrier includes a transparent surface that exposes a plurality of manufactured items positioned in the shipping carrier and a label, an imaging device positioned above the base, wherein the imaging device is oriented and adapted to capture an image of the shipping carrier, the plurality of manufactured items positioned in the shipping carrier and the label, and an image processing unit operable to extract identification data from the image, create an output file including the image, and index the output file using the extracted identification data.

Yet another illustrative system disclosed herein includes a packaging supporter comprised of a base having a top surface, a shipping carrier positioned above the top surface of the base, wherein the shipping carrier includes a transparent surface that exposes a plurality of manufactured items positioned in the shipping carrier and a display unit that is operatively coupled to an RFID chip, an imaging device positioned above the base, wherein the imaging device is oriented and adapted to capture an image of the shipping carrier, the plurality of manufactured items positioned in the shipping carrier and information displayed on the display unit, and an image processing unit operable to extract identification data from the image, create an output file including the image, and index the output file using the extracted identification data.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1:
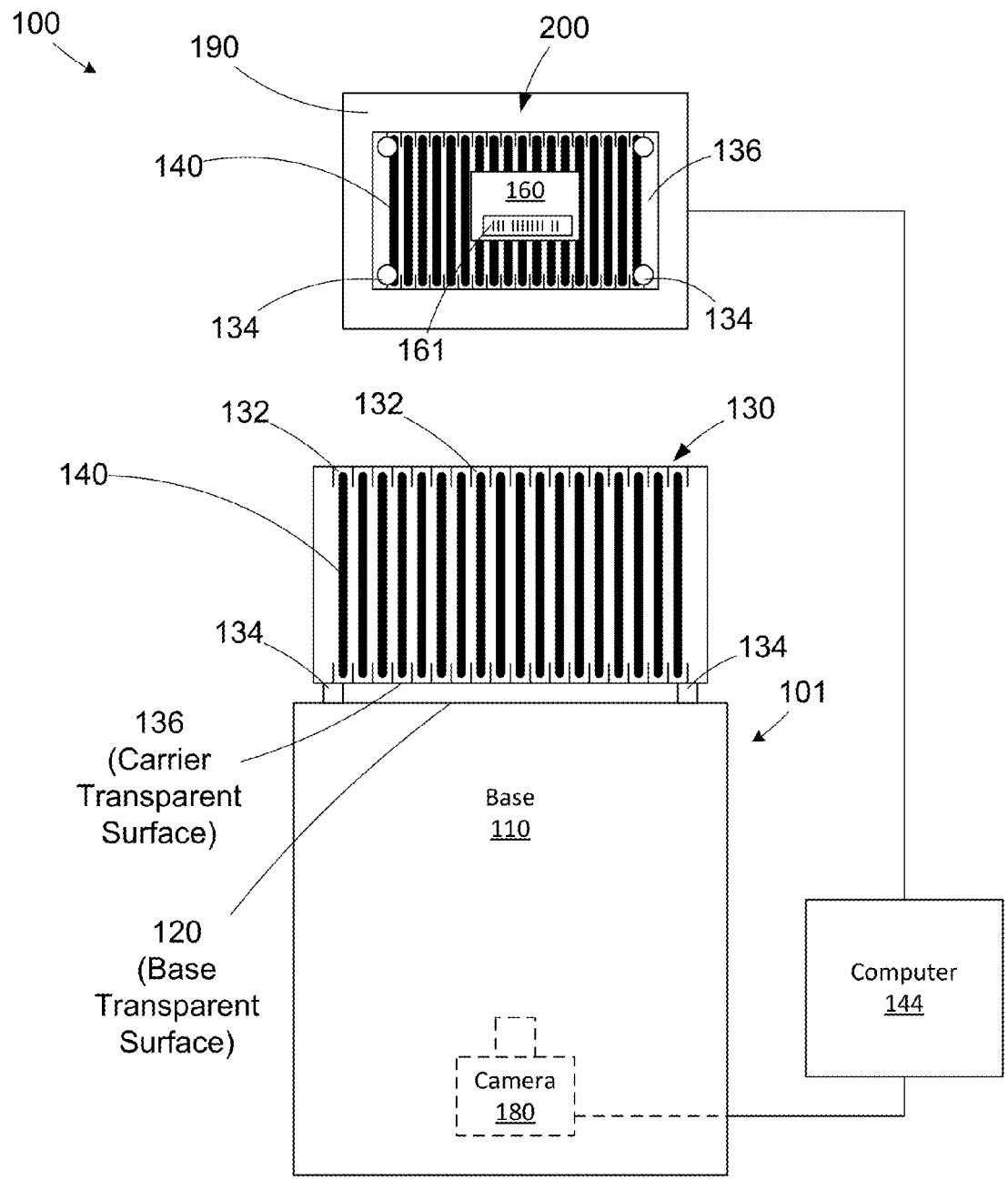
FIG. 1 is a drawing of one illustrative embodiment of a system disclosed herein that includes a packaging supporter operable to capture an image of an illustrative embodiment of a shipping carrier in accordance with one aspect of the present subject matter.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments, including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to the drawings wherein like reference numbers correspond to similar components throughout the several views and, specifically, referring to FIG. 1, the disclosed subject matter shall be described in the context of a system 100 the includes a packaging supporter 101. In one illustrative embodiment, the packaging supporter 101 depicted herein includes a base 110 including a transparent top surface 120 and an illustrative imaging device 180, such as a camera or camcorder, positioned within the base 110. A shipping carrier 130 e.g., front opening shipping box (FOSB), holding a plurality of manufactured items 140 is positioned above the transparent surface 120 of the base 110. In the illustrated embodiment, the manufactured items 140 are semiconductor wafers. In the depicted example, each of the manufactured items 140 is positioned in slots 132 formed in the shipping carrier 130. The shipping carrier 130 includes illustrative support feet 134. In the illustrated embodiment, the shipping carrier 130 has at least one transparent surface 136 to allow the manufactured items 140 to be viewed without opening the shipping carrier 130. The imaging device 180 is adapted to take an image 200, e.g., a picture of the manufactured items 140 through the transparent surface 120 of the base 110 and the transparent surface 136 of the shipping carrier 130 to thereby produce an image 200 that may be displayed on an illustrative monitor 190. The imaging device 180 may include a remote control button (not shown) that may be activated by a handler after placing the shipping carrier 130 on the transparent surface 120 of the base 110.

In this illustrative example, a label 160 is provided on the transparent surface 136 of the shipping carrier 130 to identify the manufactured items 140. The label 160 will typically contain at least information that identifies the manufactured items 140 within the shipping container 130. In the case where the manufactured items 140 are wafers, the label 160 may contain an illustrative bar code 161 that contains at least the lot identification number (Lot ID) of the manufactured wafers.

In the depicted example, the imaging device 180 is operatively coupled to the monitor 190 by way of a schematically depicted computer 144. However, in some embodiments, the imaging device 180 may be directly coupled to the monitor 190 and the computer 144 may be omitted. The monitor 190 may be positioned at any desired location and may be a stand-alone monitor or it may be mounted to a frame that is near the base 110.

Figure 2:
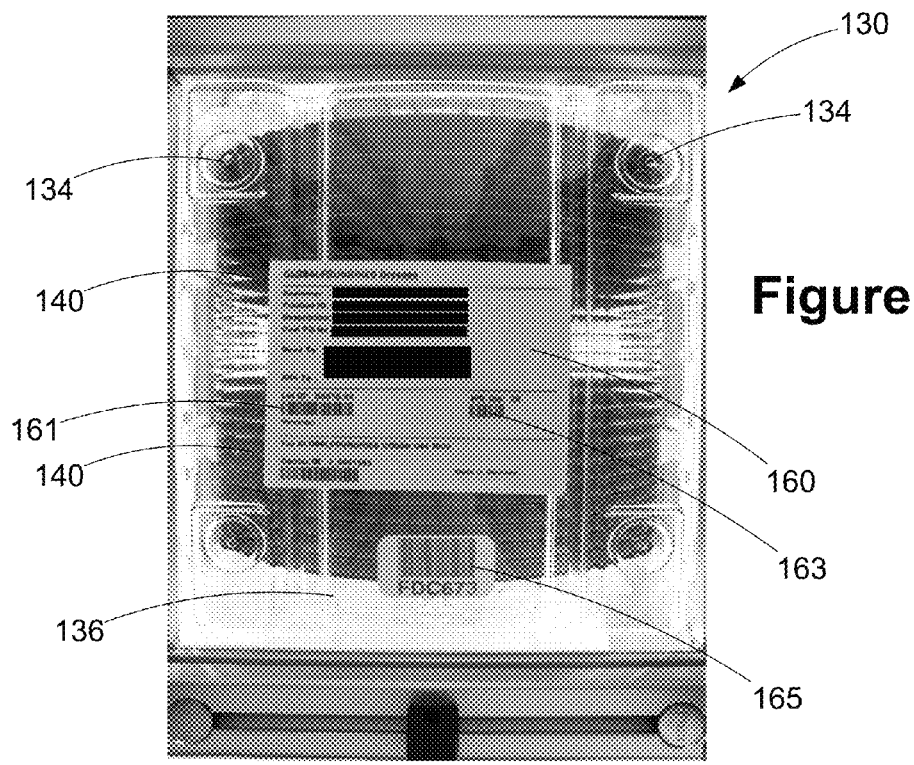
FIG. 2 is an actual image of a bottom surface of an illustrative shipping carrier taken using the system disclosed in FIG. 1.

FIG. 2 is an actual image 200 taken of a shipping carrier 130 using the system 100 described above. As can be seen, the image 200 shows that the wafers 140 are properly positioned within their respective slots within the shipping carrier 130, and the information on at least the label 160 clearly identifies which lot of wafers is the subject of the image 200. Accordingly, the image 200 can be used to prove that, at the time the manufactured items 140 were packaged for shipping, the manufactured items 140 were properly positioned within the shipping carrier 130.

That is, in the depicted example, the image 200 can be used to prove that the wafers 140 were not improperly "cross-slotted" within the shipping carrier 130 at the time the wafers were packaged and transferred to a shipping company for shipping the wafers to a customer. Such proof can be very important when the shipped goods arrive at the customer in a damaged condition, e.g., broken or chipped. Absent the image 200 taken using the system 100 disclosed herein, assigning responsibility for such damaged goods comes down to asking interested parties if they are responsible for the damaged goods. Thus, taking and maintaining the image 200 allows a manufacturer to potentially avoid the economic loss associated with the damaged goods, e.g., the shipping company may be forced to pay for the damaged goods. In addition to perhaps helping a manufacturer to avoid economic loss when the damage to the goods is not the fault of the manufacturer, the image 200 allows a manufacturer some degree of control over its reputation for quality production and packaging of its products. For example, absent definitive proof of what entity involved in the packaging and shipping of the damaged goods to the customer actually caused the damage to the goods, the customer may assume that the manufacturer caused, to at least some degree, the damage. Such a perception by a customer of a manufacturer is very harmful to the manufacturer's business reputation and can lead to a loss of a customer over time. Moreover, the image 200 taken by the system 100 disclosed herein forces employees involved in the packaging process to be more diligent as they know that the result of their efforts will be permanently recorded. After a complete reading of the present application, those skilled in the art will appreciate other aspects and benefits of the various inventions disclosed herein.

Exemplary data that may be provided on the label 160 include customer identification data, product ID, product description, customer purchase order number, destination address, responsible recipient, lot ID, quantity, and shipping company ID. All or part of the information on the label 160 may, in some embodiments, be accessed, stored or retrieved by scanning one or more illustrative bar codes 161, 163 positioned on the label 160 using known bar code scanning systems. For example, the bar code 161 may include the Lot ID number of the manufactured items 140 within the shipping carrier 130, while the bar code 163 may contain information as to the quantity of manufactured items 140 within the shipping carrier 130. In the illustrative example depicted in FIG. 2, another bar code 165 is attached separately to the transparent surface 136 of the shipping carrier 130. The bar code 165 may contain information such as a unique identification number for the shipping carrier 130.

Figure 3:
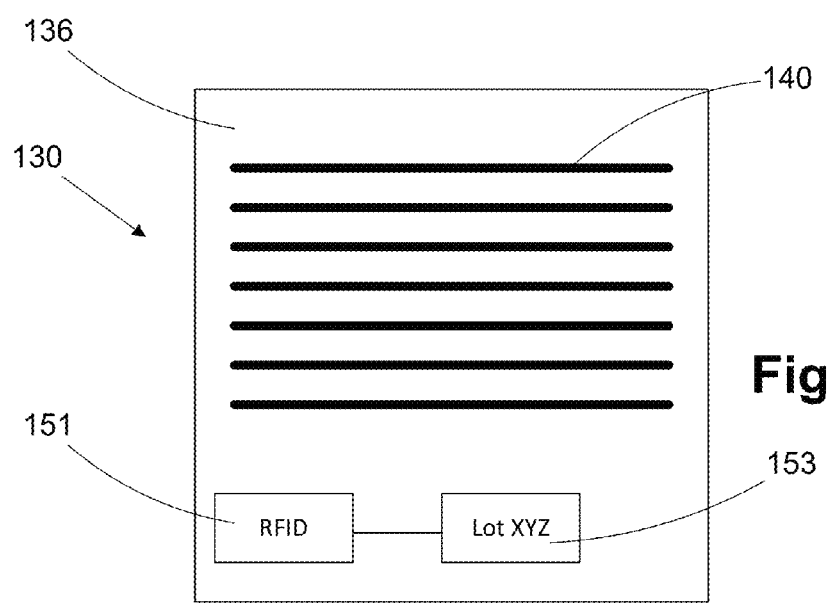
FIG. 3 is an alternative embodiment disclosed herein wherein an RFID device and associated display unit may be employed in connection with obtaining an image of the of the manufactured items within one illustrative example of a shipping carrier using the system depicted in FIG. 1.

FIG. 3 depicts an alternative embodiment of the inventions disclosed herein wherein a schematically depicted RFID chip 151 and a schematically depicted display unit 153 is part of the shipping carrier 130. In this embodiment, the RFID chip 151 is operatively coupled to the display unit 153 in such a manner that, when the RFID chip 151 is activated, information in the RFID chip 151 may be displayed on the display unit 153. The display unit 153 is positioned such that it and the manufactured items 140 are viewable through the transparent surface 136 of the shipping carrier 130. In this embodiment, the information captured in the image 200 will include the information displayed on the display unit 153 as well as the manufactured items 140. The RFID chip 151 may contain a variety of different types of information, e.g., lot ID, customer order number, and/or number of products, etc. In one embodiment, the RFID chip 151 may contain some or all of the information contained on the label 160, and some or all of that information may be displayed on the display unit 163 and captured when the image 200 is taken. In some embodiments, the shipping carrier 130 may use a combination of a label 160 and an RFID chip 151/display unit 153. In other embodiments, the RFID chip 151 and display unit 153 may be coupled to the base 110 in such a manner that the displayed information on the display 153 may be captured in the image 200.

Figure 4:
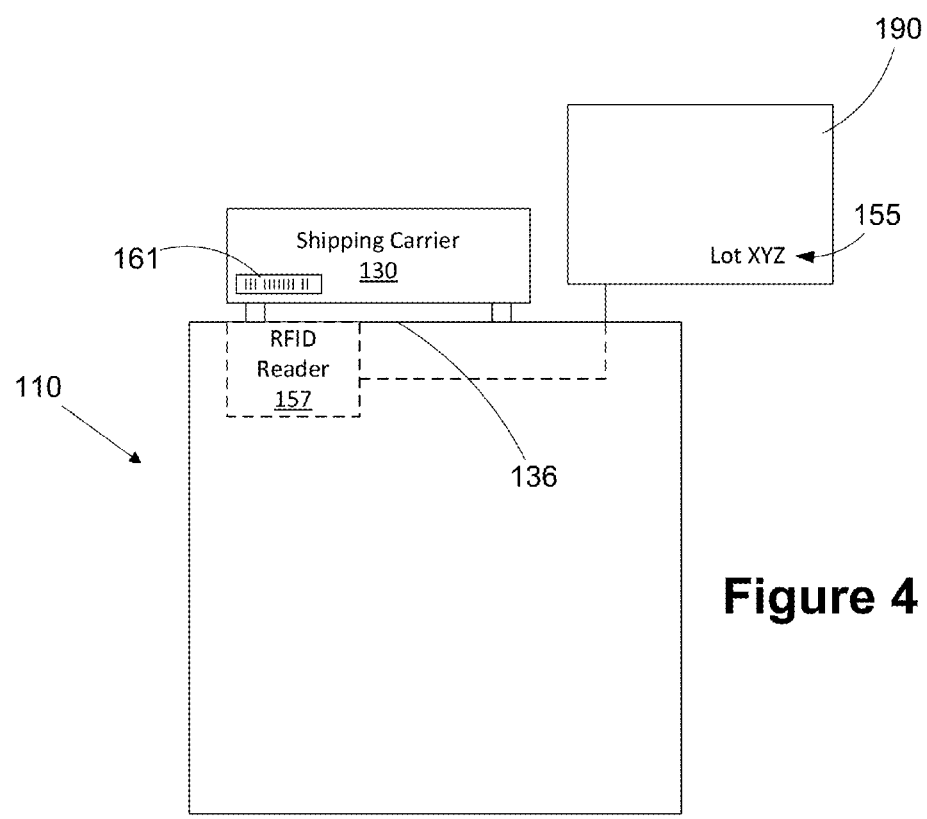
FIG. 4 is yet another alternative embodiment disclosed herein wherein an RFID reader may be employed in connection with obtaining an image of the manufactured items within one illustrative example of a shipping carrier using the system depicted in FIG. 1.

FIG. 4 depicts another illustrative embodiment disclosed herein where a schematically depicted bar code reader 157 is part of the system 100. In the depicted example, the bar code reader 157 is positioned within the base 110. In other cases, it could be mounted outside or near the base 110. In even other cases, the bar code reader 157 may be a hand-held device. The bar code reader 157 is adapted to read one or more bar codes positioned on the shipping container 130 and transmit the information in such a manner that it may be displayed on the monitor 190 so that it may be captured as part of the image 200 described above. In the depicted example, the bar code 161 contains the Lot ID number 155 ("Lot XYZ") that is read by the bar code reader 157 and displayed on the monitor 190. The bar code reader 157 may be coupled directly to the monitor 190 or it may be coupled to the monitor 190 via the computer 144 (not shown in FIG. 4).

Figure 5:
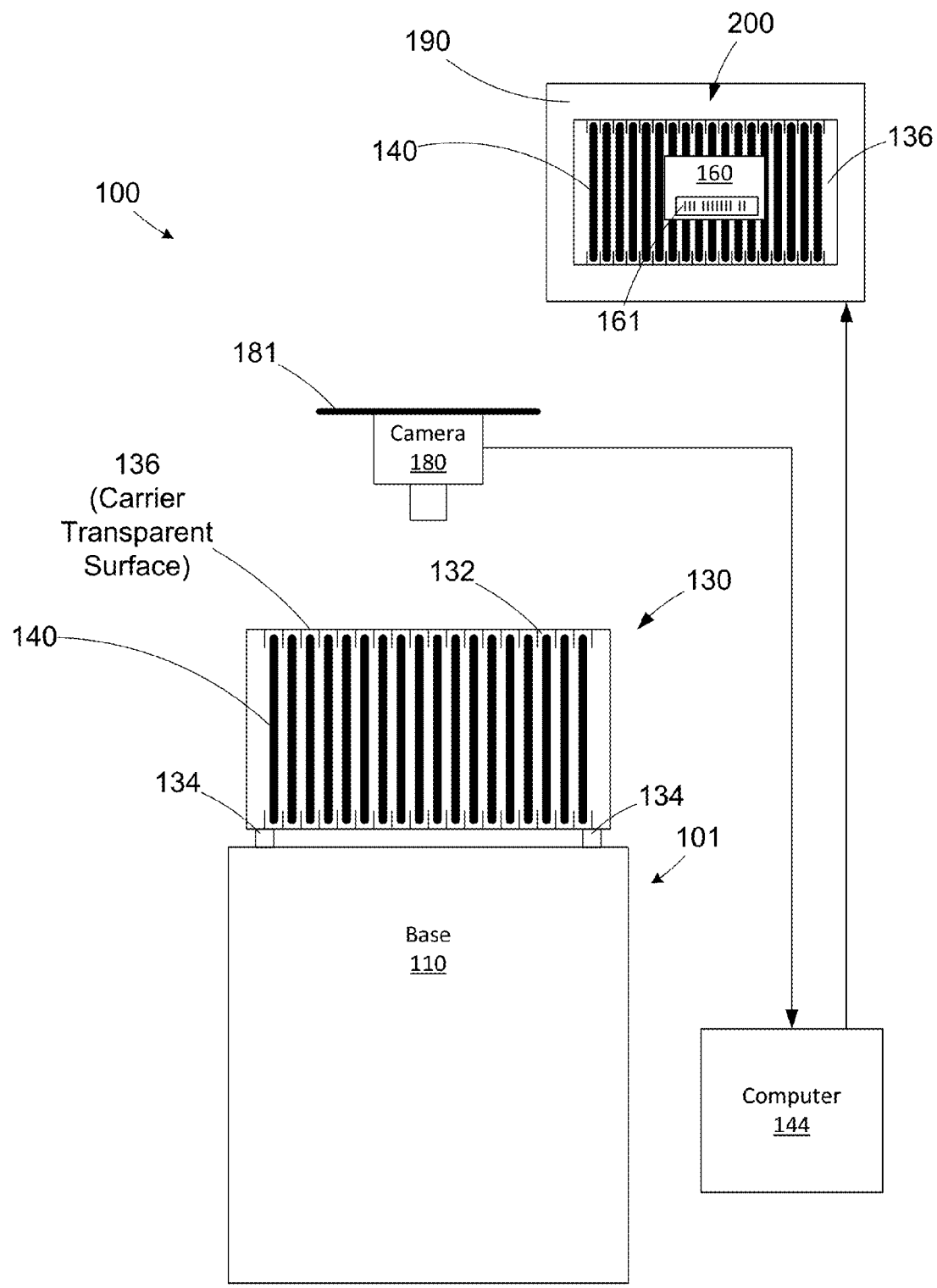
FIG. 5 is a schematic drawing of another illustrative embodiment of a system disclosed herein that includes a packaging supporter operable to capture an image of an illustrative embodiment of a shipping carrier in accordance with one aspect of the present subject matter.

FIG. 5 depicts an alternative embodiment of the system disclosed herein wherein the imaging device 180 is positioned outside of the base 110 and secured to a schematically depicted frame or structural member 181. In some embodiments, the frame 181 may also be rigidly coupled to the base 110 so that the position of the imaging device 180 relative to the base 110 may be fixed relative to one another. In this example, the base 110 may not include the previously described transparent surface 120, as the image 200 will be taken by the imaging device that is positioned outside of the base 110. In this example, the transparent surface 136 of the shipping carrier 130 is located on the upper surface of the shipping container 130. As before, the imaging device is adapted to take an image 200 of the manufactured items 140 within the shipping container 130 and display that image on the monitor 190, as previously described above. Additionally, the embodiments depicted in FIGS. 3 and 4 (described above) may also be employed with the system 100 depicted in FIG. 5.

After capturing the image 200, the handler may wrap the shipping carrier 130 for shipment. As shown in FIGS.

Figure 6A:
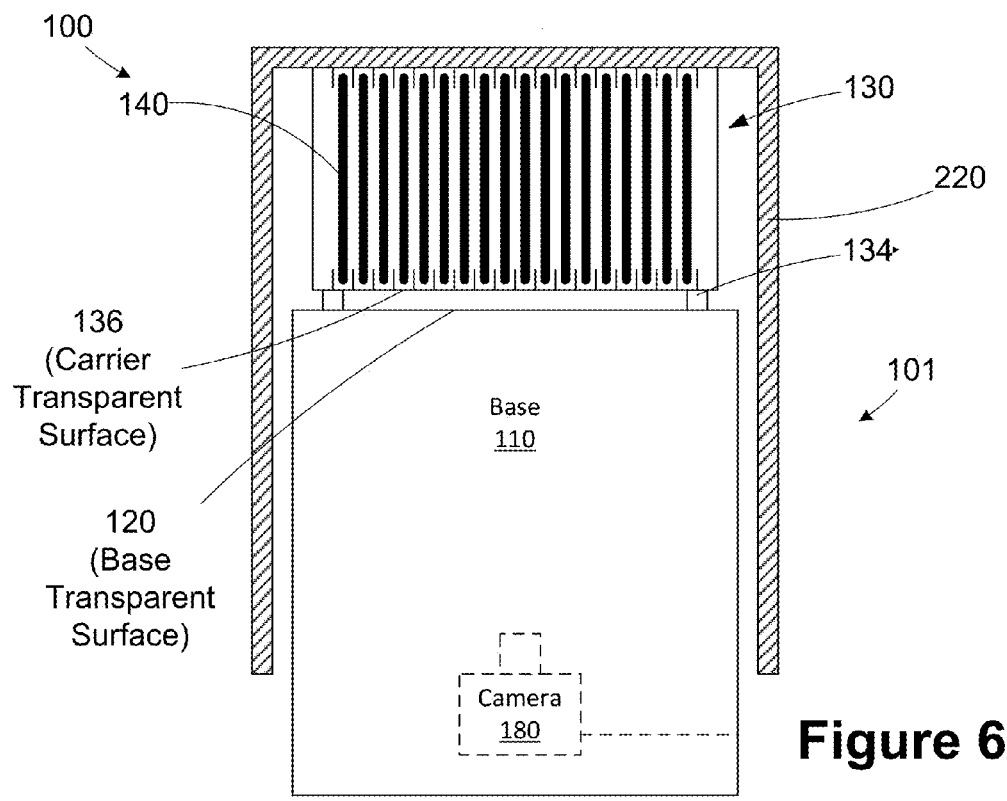
FIGS. 6A-6B are drawings illustrating the wrapping of the shipping carrier disclosed herein using one of the embodiments of the packaging supporter disclosed herein.
Figure 6B:
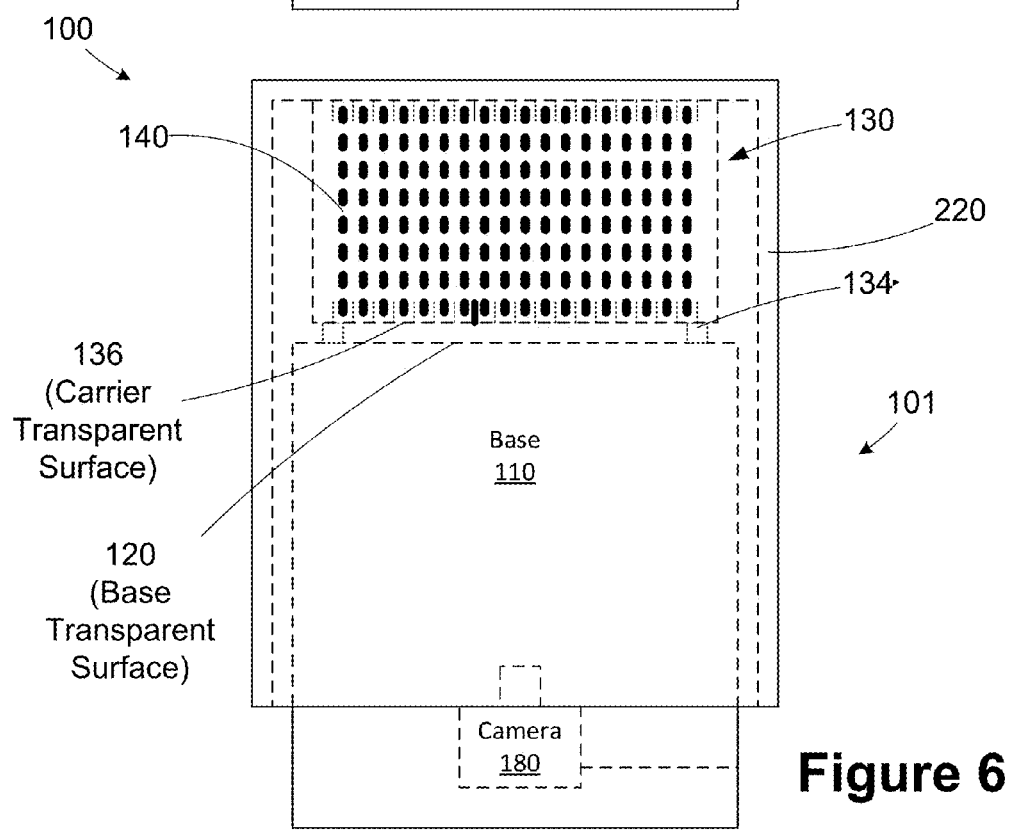

6A-6B, the wrapping operation may be conducted by slipping a shipping sleeve 220 around the shipping carrier 130 and over a portion of the base 110 without having to move the shipping carrier 130. FIG. 6A depicts the shipping sleeve 220 in cross-section, while FIG. 6B depicts a side view of the shipping sleeve 220 with various components of the system 100 shown in dashed lines. Hence, the likelihood of the manufactured items 140 being disturbed by the wrapping process is reduced, as the shipping carrier 130 remains stationary from the time at which the image 200 was captured. Thus, the image 200 allows identification of the particular manufactured items 140 in the shipping carrier 130 and also provides documentation of their proper orientation within the shipping carrier 130 (e.g., no cross-slotting or contact between wafers) prior to shipment.

Figure 7:
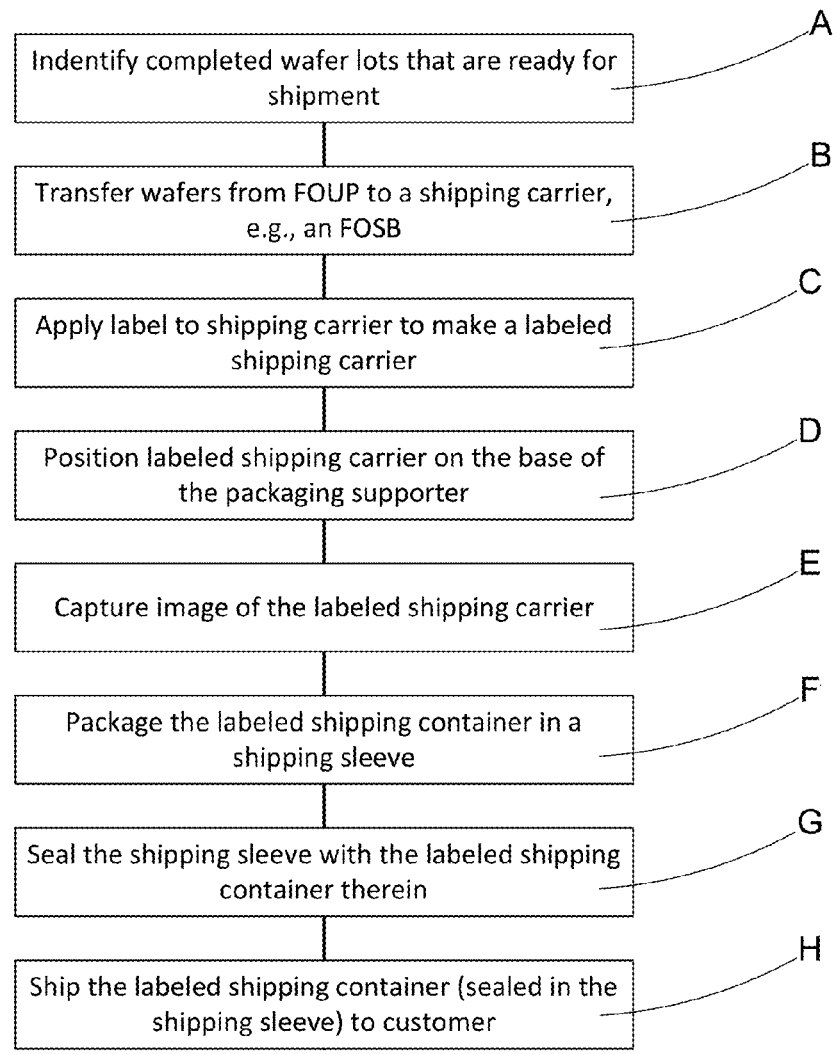
FIGS. 7 and 8 depict one illustrative process flow for collecting and processing the image captured using the illustrative systems disclosed herein.

FIG. 7 is a process flow diagram illustrating a technique for handling the packaging and documentation of the state of the shipping carrier 130. In FIG. 7, it will be assumed that the manufactured items 140 are wafers that are processed in lots during fabrication. Each of the wafer lots is positioned in a well-known front opening unified pod (FOUP) (not shown) that is used to transport the manufactured items 140, i.e., the lot of wafers, to the various tools provided in a fabrication facility for completing the necessary process steps. In step A, a plurality of groups of manufactured items 140 (e.g., wafer lots), each of which is positioned in a FOUP, are identified as being completed and ready for shipment. In step B, the manufactured items 140 are transferred from a FOUP to a shipping carrier 130 (FOSB). A wafer sorter (not shown) may complete the transfer of the wafers from the FOUP to the shipping carrier 130. A label 160 may be applied to the shipping carrier 130 in step C. To the extent that the above-described RFID chip 151 and/or display unit 153 are used, they may also be attached to the shipping carrier 130 at this point or they may have been previously attached to the shipping carrier 130. Attachment of the label 160 and/or the RFID chip 151/display unit 153 to the shipping carrier 130 now transforms the shipping carrier 130 into what will be generically referred to as a labeled shipping carrier 130.

In step D, the labeled shipping carrier 130 is positioned on the top surface 120 of the base 110 of the packaging supporter 101 with the transparent surface 136 oriented toward the imaging device 180. In step E, a handler activates the imaging device 180 directly or via remote control so as to capture the image 200. In step F, the handler packages the labeled shipping carrier 130 in the shipping sleeve 220 while it is present on the base 110. In step G, the shipping sleeve 220 is sealed, and the packaged and labeled shipping carrier 130 is shipped in step H.

Figure 8:
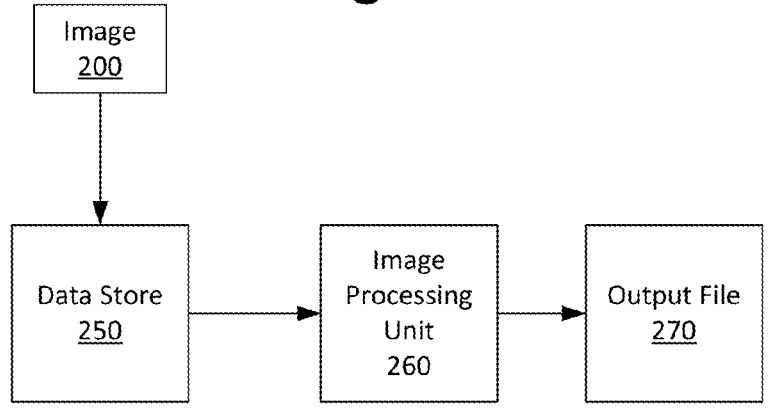

As shown in FIG. 8, after the image 200 is captured in step E, it is stored in a data store 250, such as a network drive or share space. The image 200 may also be stored locally in a storage device associated with the imaging device 180. An image processing unit 260 extracts identification data provided on the label 160 and/or RFID chip 151 from the image 200, creates an output file 270 including the image, and indexes the output file 270 using the extracted identification data. The image processing unit 260 may run an optical character recognition (OCR) routine on the image 200 to extract the identification data (e.g., customer identification data, product ID, product description, customer purchase order number, destination address, responsible recipient, lot ID, quantity, carrier ID, etc.). In the illustrated embodiment, the output file 270 may comprise a portable document file (PDF) that is indexed by the data collected from the image 200.

Figure 9:
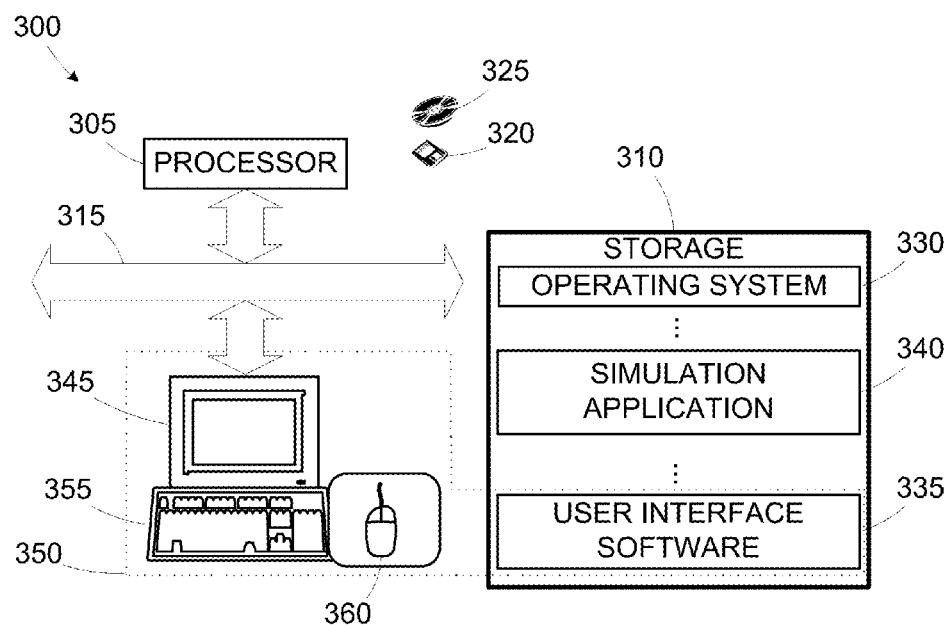
FIG. 9 is a simplified block diagram of a computing apparatus implementing an image processing application in accordance with another aspect of the present subject matter.

FIG. 9 provides a simplified diagram of selected portions of the hardware and software architecture of the computing apparatus 300 such as may be employed in some aspects of the present subject matter, such as to implement the image processing unit 260 illustrated in FIG. 8. The computing apparatus 300 includes a processor 305 communicating with storage 310 over a bus system 315. The storage 310 may include a hard disk and/or random access memory (RAM) and/or removable storage, such as a magnetic disk 320 or an optical disk 325. The storage 310 is also encoded with an operating system 330, user interface software 335, and an image processing application 340 operable to retrieve the captured image 200 from the camera 180, perform the OCR data capture, generate the output file 270, and index the output file based on the OCR data. The user interface software 335, in conjunction with a display 345, implements a user interface 350. The user interface 350 may include peripheral I/O devices such as a keypad or keyboard 355, mouse 360, etc. The processor 305 runs under the control of the operating system 330, which may be practically any operating system known in the art. The image processing application 340 is invoked by the operating system 330 upon power up, reset, user interaction, etc., depending on the implementation of the operating system 330. The image processing application 340, when invoked, performs one of the various methods disclosed herein. The user may invoke the image processing application 340 in conventional fashion through the user interface 350. Note that although a stand-alone system is illustrated, there is no need for the data to reside on the same computing apparatus 300 as the image processing application 340 by which it is processed. Some embodiments of the present subject matter may therefore be implemented on a distributed computing system with distributed storage and/or processing capabilities.

It is contemplated that, in some embodiments, the image processing application 340 may be executed by the computing apparatus 300 to implement the image processing techniques described herein with reference to FIG. 8. Data for the image processing may be stored on a computer readable storage device (e.g., storage 310, disks 320, 325, solid state storage, etc.).

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method for capturing the state of a shipping carrier, comprising:
   capturing an image of a shipping carrier including a plurality of slots for receiving a plurality of semiconductor wafers and a transparent surface exposing the plurality of semiconductor wafers and a label, wherein said shipping carrier is positioned on a surface when said image is captured;
   extracting identification data provided on the label from the image;
   creating an output file including the image;
   indexing the output file using the extracted identification data;

positioning a shipping sleeve around at least a portion of said shipping carrier while said shipping carrier is positioned on said surface; and upon need, accessing the image to prove a correct positioning of the semiconductor wafers in the plurality of slots.

2. The method of claim 1, wherein extracting the identification data comprises performing an optical character recognition routine on the captured image.

3. The method of claim 1, further comprising sealing said shipping sleeve.

4. A method for capturing the state of a shipping carrier, comprising:

capturing an image of a shipping carrier including a transparent surface exposing a plurality of manufactured items therein and identification data displayed on a display unit mounted to said shipping carrier and operatively coupled to an RFID chip storing the identification data;

extracting the identification data provided on the display unit from the image;

creating an output file including the image; and indexing the output file using the extracted identification data;

wherein said shipping carrier is positioned on a surface when said image is captured and wherein the method further comprises positioning a shipping sleeve around at least a portion of said carrier while said shipping carrier is positioned on said surface.

5. The method of claim 4, wherein extracting the identification data comprises performing an optical character recognition routine on the captured image.

6. The method of claim 4, further comprising sealing said shipping sleeve.

7. A system, comprising: a packaging supporter comprising a base having a transparent top surface; a shipping carrier positioned above said transparent top surface of said base, wherein said shipping carrier includes a transparent surface exposing a plurality of manufactured items positioned in said shipping carrier and a display unit that displays identification data and is operatively coupled to an RFID chip storing the identification data;

an imaging device positioned within said base capturing an image of said shipping carrier, said plurality of manufactured items positioned in said shipping carrier and the identification data displayed on said display unit; and an image processing unit operable to extract the identification data from the image, create an output file including the image, and index the output file using the extracted identification data.

8. The system of claim 7, wherein said manufactured items are semiconductor wafers.

9. The system of claim 7, further comprising a monitor that is operatively coupled to said imaging device to display said image.

10. A system, comprising:

a packaging supporter comprising a base having a top surface;

a shipping carrier positioned above said top surface of said base, wherein said shipping carrier includes a transparent surface exposing a plurality of manufactured items positioned in said shipping carrier and a display unit that displays identification data and is operatively coupled to an RFID chip storing the identification data;

an imaging device positioned above said top surface of said base to capture an image of said shipping carrier, said plurality of manufactured items positioned in said shipping carrier and the identification data displayed on said display unit; and an image processing unit operable to extract identification data from the image, create an output file including the image, and index the output file using the extracted identification data.

11. The system of claim 10, wherein said manufactured items are semiconductor wafers.

12. The system of claim 10, further comprising a monitor that is operatively coupled to said imaging device to display said image.

* * * * *

UNITED STATES PATENT AND TRADEMARK OFFICE
CERTIFICATE OF CORRECTION

PATENT NO. : 9,489,553 B2
APPLICATION NO. : 13/917088
DATED : November 8, 2016
INVENTOR(S) : Sebastian Uebe et al.

Page 1 of 1

It is certified that error appears in the above-identified patent and that said Letters Patent is hereby corrected as shown below:

In the Claims

Column 9, Line 28 (Claim 4, Line 17), change "said carrier" to -- said shipping carrier --.

Signed and Sealed this
Fourteenth Day of February, 2017

Michelle K. Lee
*Director of the United States Patent and Trademark Office*